(12) United States Patent
Hill et al.

(10) Patent No.: US 11,300,524 B1
(45) Date of Patent: Apr. 12, 2022

(54) PUPIL-PLANE BEAM SCANNING FOR METROLOGY

(71) Applicant: KLA Corporation, Milpitas, CA (US)

(72) Inventors: Andrew V. Hill, Berkeley, CA (US); Amnon Manassen, Haifa (IL); Avi Abramov, Haifa (IL); Asaf Granot, Lotem (IL); Andrei V. Shchegrov, Campbell, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/142,783

(22) Filed: Jan. 6, 2021

(51) Int. Cl.
*G01N 21/95* (2006.01)
*G01B 11/27* (2006.01)
*G03F 7/20* (2006.01)

(52) U.S. Cl.
CPC ....... *G01N 21/9501* (2013.01); *G01B 11/272* (2013.01); *G03F 7/70616* (2013.01); *G03F 7/70625* (2013.01); *G03F 7/70633* (2013.01)

(58) Field of Classification Search
CPC ............. G03F 7/70616; G03F 7/70625; G03F 7/70633; G03F 7/70641; G03F 7/7065; G01B 11/02; G01B 11/022; G01B 11/024; G01B 11/028; G01B 11/04; G01B 11/06; G01B 11/0616; G01B 11/0625; G01B 11/0633; G01B 11/065; G01B 11/08; G01B 11/10; G01B 11/105; G01B 11/14; G01B 11/16; G01B 11/24; G01B 11/26; G01B 11/27; G01B 11/272; G01B 11/28; G01B 11/285; G01B 11/30; G01B 11/303; G01B 11/306; G01N 21/9501
See application file for complete search history.

(56) References Cited

U.S. PATENT DOCUMENTS 7,268,343 B2 * 9/2007 Goldberg ........... G02B 21/0016
 250/227.14
9,091,650 B2 * 7/2015 Hill ........................ G01B 11/00
(Continued)

OTHER PUBLICATIONS

Andrew V. Hill et al., U.S. Appl. No. 16/586,504, filed Sep. 17, 2019, entitled Sensitive Optical Metrology in Scanning and Static Modes.
(Continued)

*Primary Examiner* — Gordon J Stock, Jr.
(74) *Attorney, Agent, or Firm* — Suiter Swantz pc llo

(57) ABSTRACT

A metrology measurement apparatus may include one or more illumination sources, a beamsplitter configured to receive illumination from the one or more illumination sources from an illumination pathway and direct the illumination along a measurement pathway, and an objective lens. The objective lens may direct the illumination from the measurement pathway to a sample, collect light from the sample, and direct the collected light along the measurement pathway to the beamsplitter such that the beamsplitter may direct the collected light along a collection pathway to a detector. The apparatus may further include a pupil-plane scanner along the measurement pathway with a pupil relay and a deflector in a relayed pupil plane such that adjusting the deflector adjusts a position of the illumination spot on the sample without modifying a position of the illumination pupil distribution or a position of a distribution of the collected light along the collection pathway.

27 Claims, 5 Drawing Sheets

(56) References Cited

U.S. PATENT DOCUMENTS

| | | | | |
|---|---|---|---|---|
| 9,970,883 B2* | 5/2018 | Sullivan | ............ | G01N 21/8851 |
| 10,101,676 B2* | 10/2018 | Fu | ......................... | G03F 9/7046 |
| 10,401,738 B2* | 9/2019 | Hill | ....................... | G01B 11/14 |
| 10,527,830 B2* | 1/2020 | Hill | ................... | G02B 27/0025 |
| 10,976,249 B1* | 4/2021 | Hill | ....................... | G01N 21/47 |
| 2020/0124408 A1* | 4/2020 | Hill | ................... | G01N 21/9505 |

OTHER PUBLICATIONS

Andrew V. Hill et al., U.S. Appl. No. 16/598,146, filed Oct. 10, 2019, entitled Metrology Target for Scanning Metrology.
Andrew V. Hill et al., U.S. Appl. No. 17/140,999, filed Jan. 4, 2021, entitled Scanning Scatterometry Overlay Measurement.

\* cited by examiner

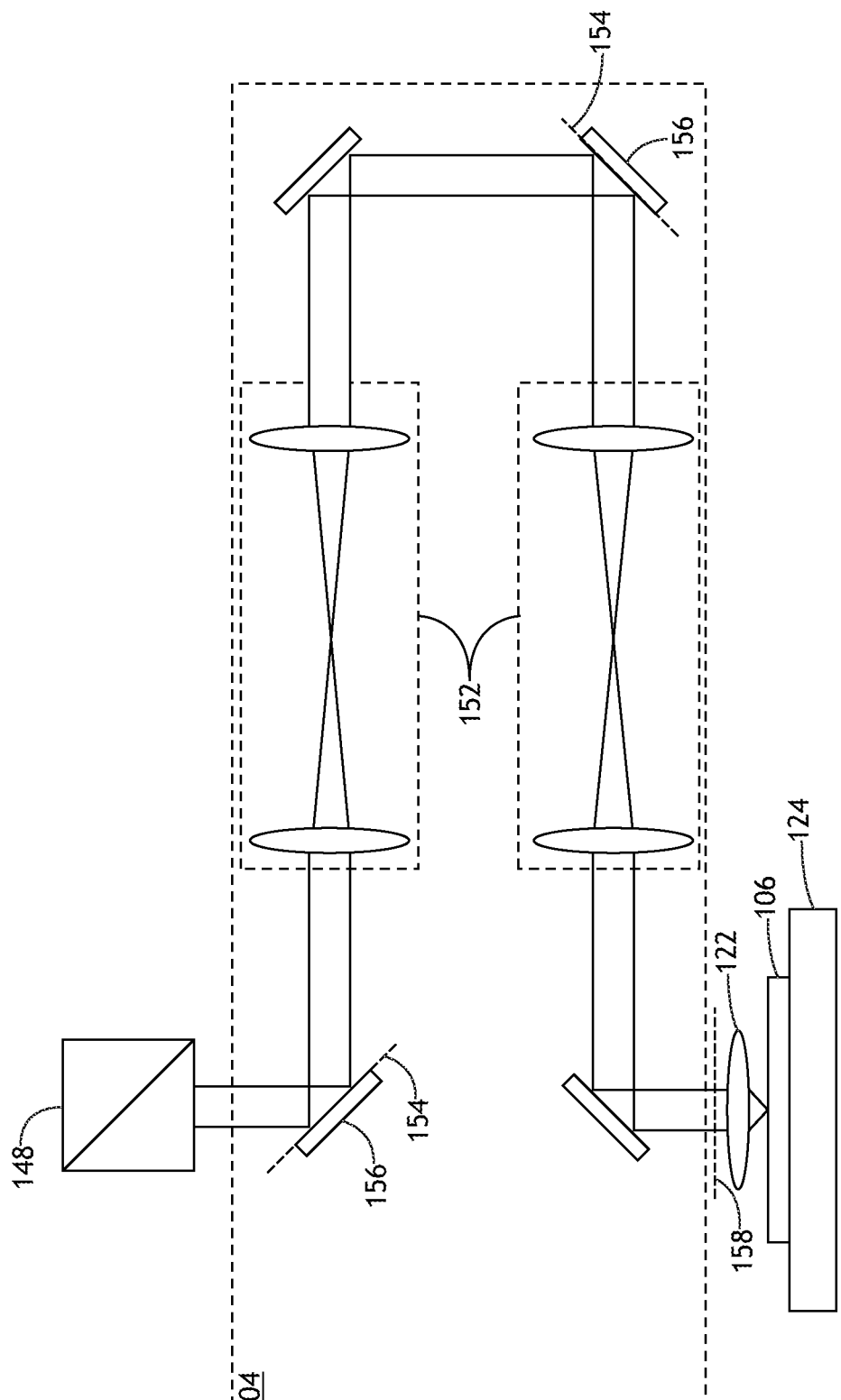

PUPIL-PLANE BEAM SCANNING FOR METROLOGY

TECHNICAL FIELD

The present disclosure relates generally to metrology systems and, more particularly, to positioning of illumination light in metrology systems.

BACKGROUND

Metrology systems used in semiconductor manufacturing processes such as, but not limited to, overlay metrology systems typically characterize metrology targets located on a sample. In some diffraction-based metrology techniques, a metrology measurement is generated based on an angular distribution of light from the sample (e.g., reflected and/or diffracted light). Further, it may be desirable to selectively control a position of an illumination spot on a sample prior to or during a measurement. However, traditional techniques for spot scanning may generally introduce deviations of the distribution of illumination light on the sample or collected light on a detector, which may negatively impact the metrology measurement. It may therefore be desirable to provide systems and methods for curing these deficiencies.

SUMMARY

A metrology measurement apparatus is disclosed in accordance with one or more illustrative embodiments of the present disclosure. In one illustrative embodiment, the apparatus includes one or more illumination sources. In another illustrative embodiment, the apparatus includes a beamsplitter to receive illumination from the one or more illumination sources from an illumination pathway and direct the illumination along a measurement pathway. In another illustrative embodiment, the apparatus includes an objective lens to direct the illumination from the measurement pathway to a sample. In another illustrative embodiment, the illumination is arranged to provide a selected illumination pupil distribution in a pupil plane of the objective lens defining incidence angles of the illumination on the sample and is further arranged to provide an illumination spot on the sample having a smaller spot size than a field of view of the objective lens. In another illustrative embodiment, the objective lens further collects light from the sample and directs the collected light along the measurement pathway. In another illustrative embodiment, the beamsplitter further receives the collected light from the measurement pathway and directs the collected light along a collection pathway to one or more detectors. In another illustrative embodiment, the apparatus includes a pupil-plane scanner located between the objective lens and the beamsplitter along the measurement pathway. In another illustrative embodiment, the pupil-plane scanner includes a pupil relay between the objective lens and the beamsplitter along the measurement pathway to relay a pupil plane from the objective lens to one or more relayed pupil planes located between the objective lens and the beamsplitter along the measurement pathway and one or more deflectors located in at least one of the one or more relayed pupil planes. In another illustrative embodiment, adjusting angular positions of the one or more deflectors adjusts a position of the illumination spot on the sample without modifying a position of the illumination pupil distribution or a position of a distribution of the collected light along the collection pathway.

A metrology system is disclosed in accordance with one or more illustrative embodiments of the present disclosure. In one illustrative embodiment, the system includes an illumination source. In another illustrative embodiment, the system includes a pupil-plane detector. In another illustrative embodiment, the system includes a translatable stage configured to position a sample. In another illustrative embodiment, the system includes a beamsplitter to receive illumination from the illumination source and direct the illumination along a measurement pathway. In another illustrative embodiment, the system includes an objective lens to direct the illumination from the measurement pathway to the sample, the objective lens further collects light from the sample and directs the collected light along the measurement pathway. In another illustrative embodiment, the beamsplitter further receives the collected light from the measurement pathway and directs the collected light along a collection pathway to the pupil-plane detector. In another illustrative embodiment, the system includes an optical relay between the objective lens and the beamsplitter along the measurement pathway, where the optical relay provides one or more relayed pupil planes between the objective lens and the beamsplitter, and where the optical relay further provides a relayed field plane between the objective lens and the beamsplitter. In another illustrative embodiment, the system includes one or more deflectors located at the one or more relayed pupil planes. In another illustrative embodiment, adjusting the one or more deflectors adjusts a position of illumination from the illumination source on the sample while maintaining a stable optical path of the collected light along the collection pathway. In another illustrative embodiment, the system includes a feedback detector located at the relayed field plane to image the position of the illumination from the illumination source on the sample. In another illustrative embodiment, the system includes a controller communicatively coupled to the translatable stage and the feedback detector to receive one or more images from the feedback detector including the location of the illumination from the illumination source on the sample; send control signals to the one or more deflectors to position the illumination from the illumination source, based on one or more images from the feedback detector, on a selected measurement spot for a measurement; receive one or more measurement images from the pupil-plane detector; and generate one or more metrology measurements based on the one or more measurement images.

A metrology method is disclosed in accordance with one or more illustrative embodiments of the present disclosure. In one illustrative embodiment, the method includes illuminating a sample by directing illumination from an illumination source through a beamsplitter, along a measurement pathway, and through an objective lens. In another illustrative embodiment, the method includes collecting light from the sample with the objective lens and directing the collected light along the measurement pathway and through the beamsplitter to a detector located at a pupil plane. In another illustrative embodiment, the method includes adjusting a position of the illumination from the illumination source on the sample with one or more deflectors located at one or more relayed pupil planes between the objective lens and the beamsplitter, where adjusting the one or more deflectors adjusts a position of illumination from the illumination source on the sample while maintaining a stable position of the collected light on the detector.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 1D is a schematic view of the pupil-plane scanner with two deflectors, in accordance with one or more embodiments of the present disclosure.

DETAILED DESCRIPTION

Figure 1A:
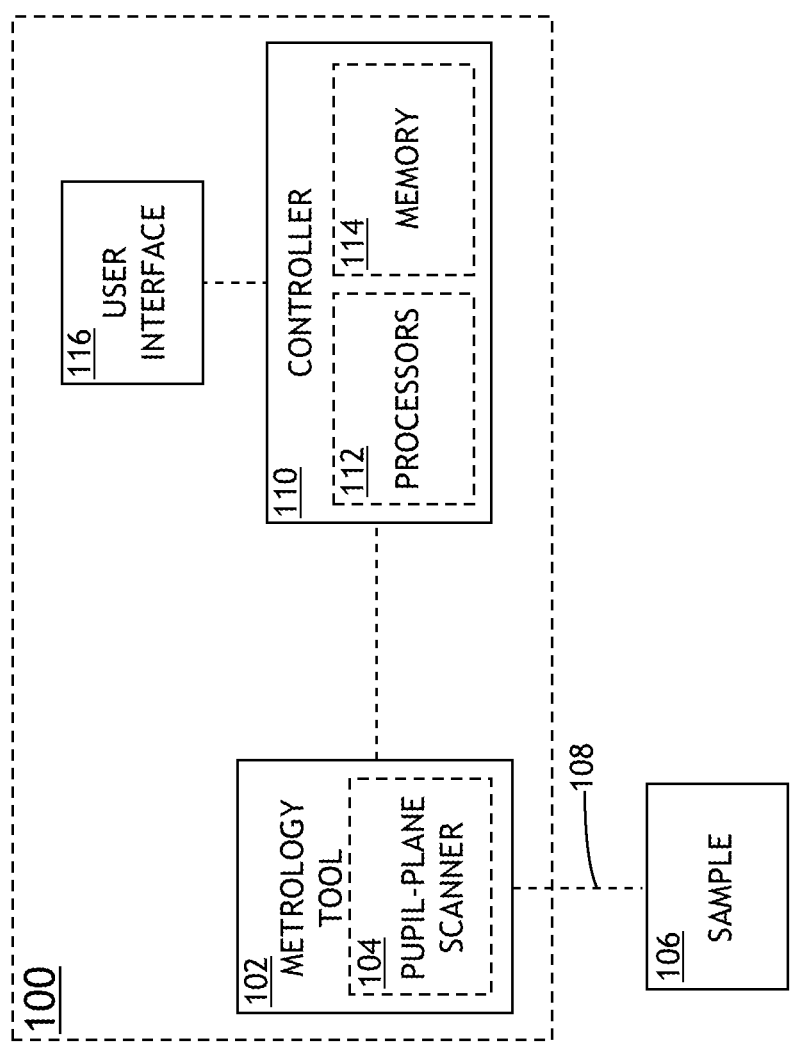
FIG. 1A is a conceptual view of a metrology system including a metrology tool having a pupil-plane scanner, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for positioning an illumination spot in a metrology system based on deflectors located in pupil planes common to both illumination and collection pathways. In this way, a position of an illumination spot on a sample may be controlled without impacting an angular distribution of illumination on the sample (e.g., an illumination pupil distribution) and without impacting an angular distribution of collected light from the sample (e.g., a collection pupil distribution). It is contemplated that the systems and methods disclosed herein may enable precise positioning of an illumination spot on a sample prior to and/or during a measurement without negatively impacting the measurement itself. For example, the illumination spot may be modulated, scanned, or otherwise varied within a selected region of the sample (e.g., a cell of a metrology target) during a measurement without impacting the positions of either the illumination or collection pupil distributions. This may be useful for, but is not limited to, mitigating speckle associated with coherent illumination and noise associated with target edge roughness. By way of another example, the illumination spot may be sequentially positioned on different locations of the sample (e.g., different cells of a metrology target) for sequential measurements without requiring translation of the sample between the measurements, which may increase throughput and measurement stability.

In some embodiments, a metrology system includes a pupil-plane scanner located in a measurement pathway that is common to both an illumination and a collection pathway. For example, the measurement pathway may be located between an objective lens and a beamsplitter in a configuration where a single objective lens is used to both illuminate the sample and collect light from the sample for a measurement. In one embodiment, the pupil-plane scanner includes a pupil-plane relay to relay a pupil plane from the objective lens (e.g., associated with a back-focal plane of the objective lens) to one or more relayed pupil planes along the measurement pathway and one or more deflectors located in at least one of the relayed pupil planes. In this way, adjusting the angle of a deflector in a relayed pupil plane may modify a position of an illumination spot on the sample. However, since the deflector is in a pupil plane, common to the illumination and collection pathways, adjusting the angle of the deflector does not impact positions of either the illumination or collection pupil distributions. As a result, spot positioning or scanning is achieved while maintaining a stable angular illumination distribution on the sample as well as a stable distribution of light in a collection pupil.

It is contemplated herein that this configuration may be particularly beneficial for, but is not limited to, diffraction-based metrology or scatterometery metrology in which a metrology measurement is based on illumination of a metrology target with illumination over a limited angular range and collection of selected diffraction orders. In these systems, variations of the collection pupil distribution associated with positioning or scanning the illumination beam may manifest as measurement errors and/or may reduce measurement sensitivity.

In another embodiment, a metrology system further includes a field-plane imaging detector to image a location of an illumination spot on a sample. Such a field-plane imaging detector may be used for feedback to monitor or control the positioning of the illumination spot and may generally be located at any suitable field plane in the system. For example, the metrology system may include a beamsplitter in the measurement plane and a field-plane imaging detector located at a relayed field plane (e.g., an intermediate field plane). By way of another example, the metrology system may include a beamsplitter in the collection plane and a field-plane imaging detector located at a collection field plane.

As used throughout the present disclosure, the term "sample" generally refers to a substrate formed of a semiconductor or non-semiconductor material (e.g., a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist (including a photoresist), a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable. In addition, for the purposes of the present disclosure, the terms patterning device, mask and reticle should be interpreted as interchangeable.

Figure 1B:
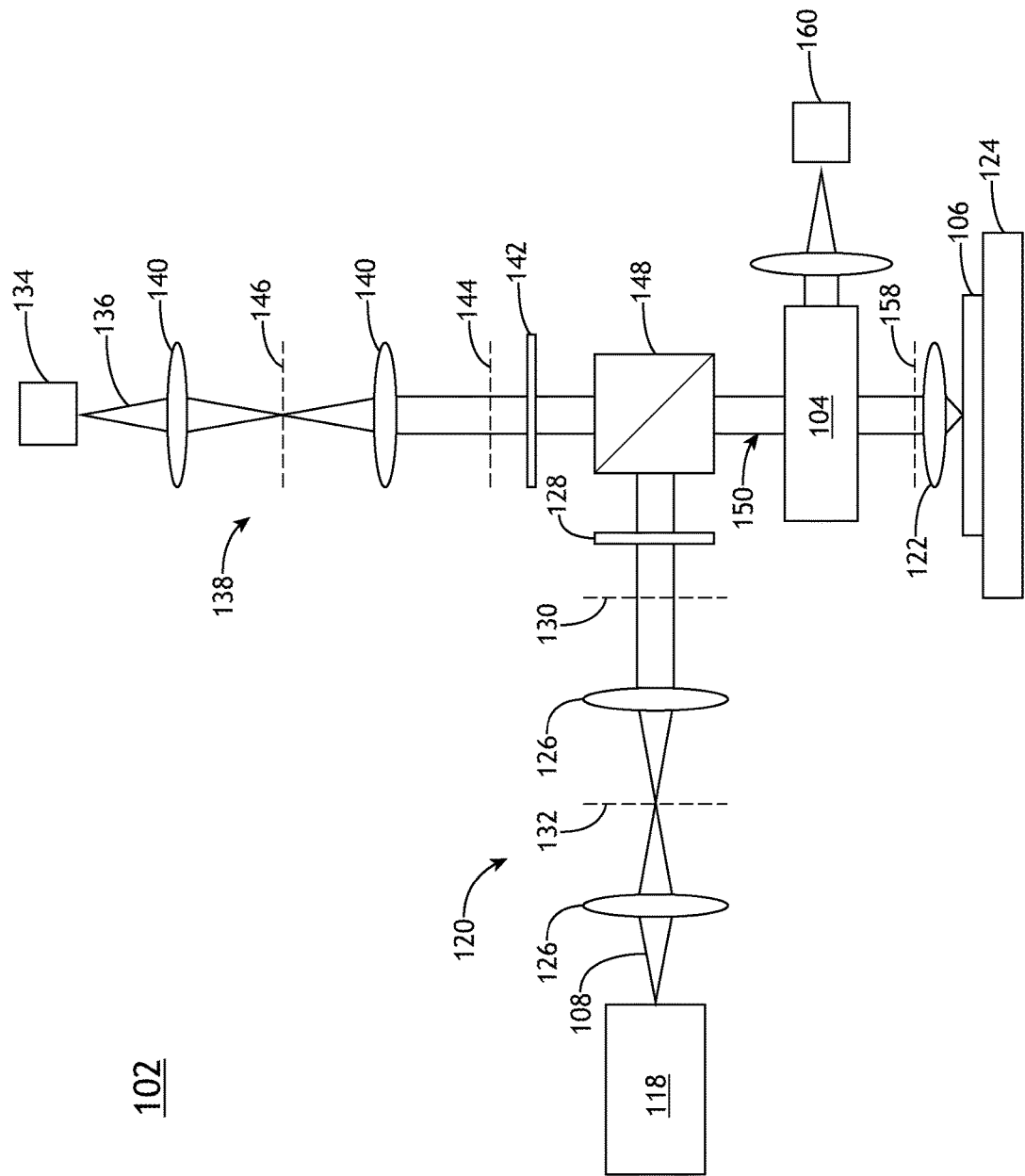
FIG. 1B is a conceptual view of the metrology tool, in accordance with one or more embodiments of the present disclosure.
Figure 1C:
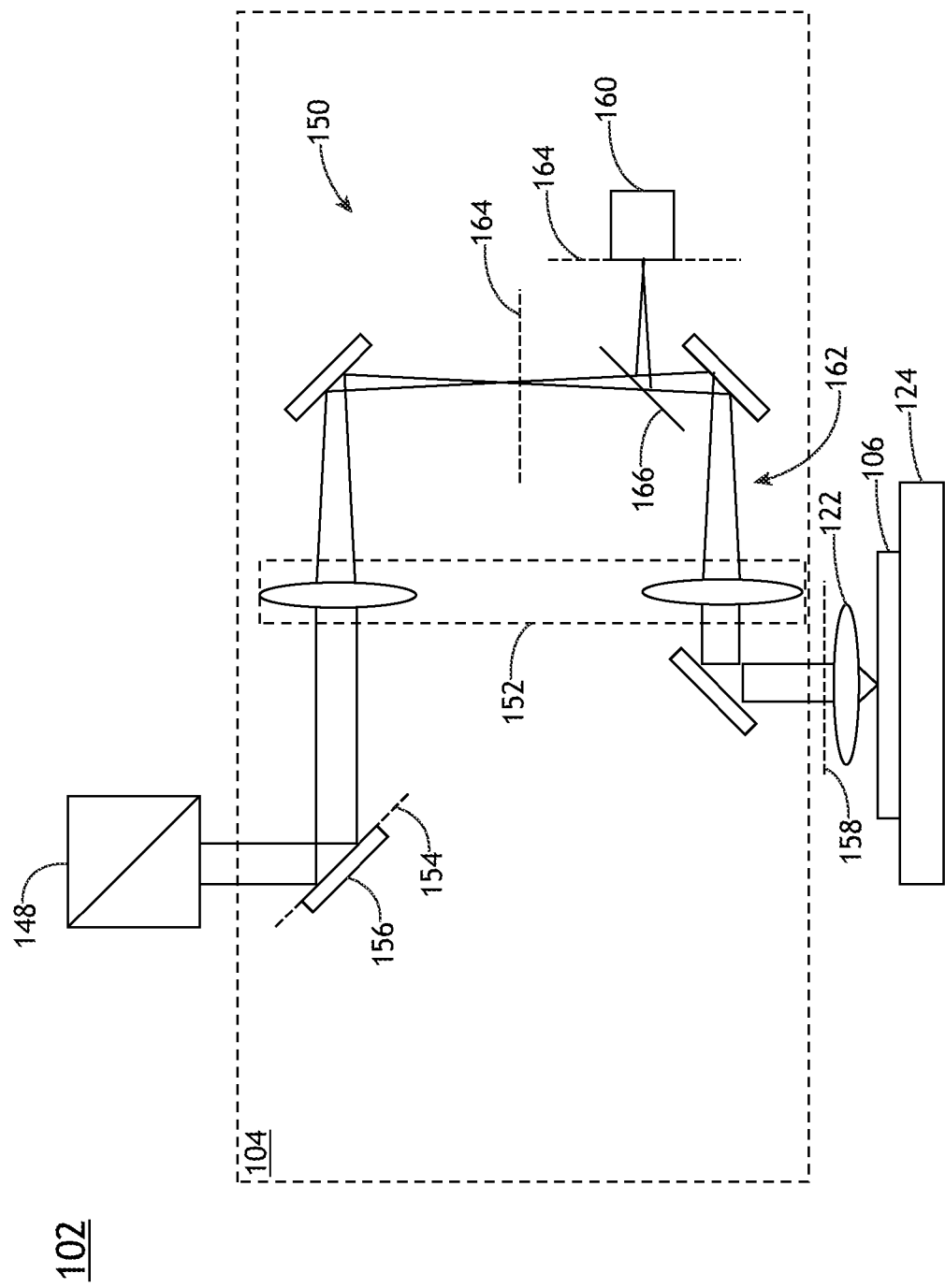
FIG. 1C is a schematic view of the pupil-plane scanner with a single deflector providing multi-axis angular deflection, in accordance with one or more embodiments of the present disclosure.
Figure 2:
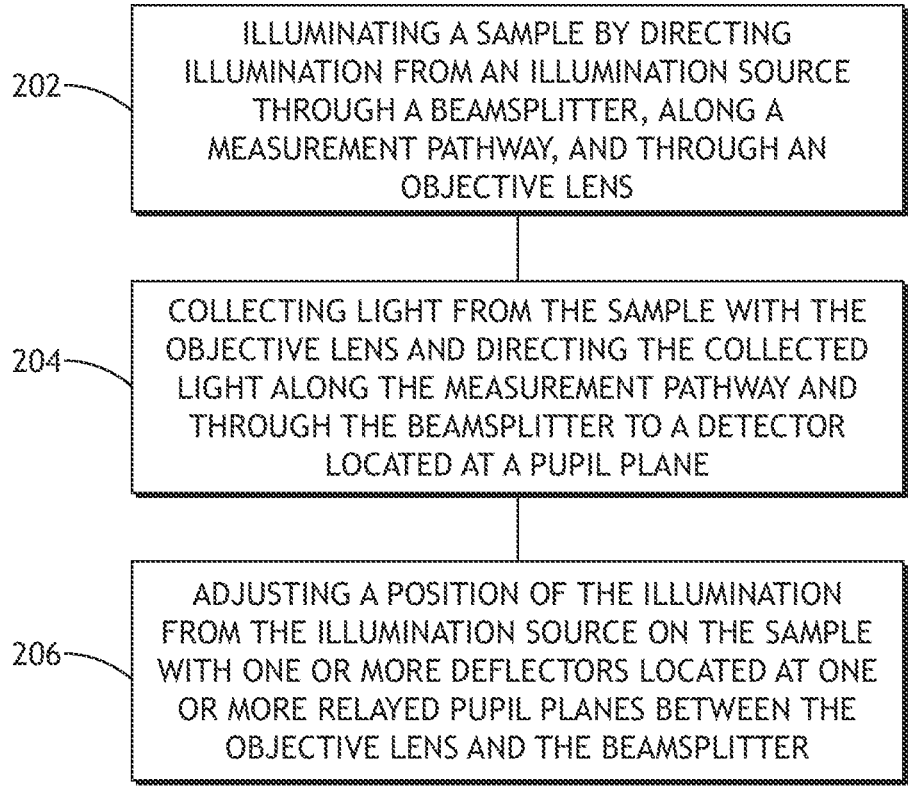
FIG. 2 is a flow diagram illustrating steps performed in a metrology method, in accordance with one or more embodiments of the present disclosure.

Referring now to FIGS. 1A-2, systems and methods for pupil-plane scanning are described in greater detail in accordance with one or more embodiments of the present disclosure.

FIG. 1A is a conceptual view of a metrology system 100 including a metrology tool 102 having a pupil-plane scanner 104, in accordance with one or more embodiments of the present disclosure.

The metrology tool 102 may include any type of optical metrology tool known in the art suitable for generating metrology measurements of a sample 106 based on interrogation of the sample 106 with optical illumination 108. Further, the metrology tool 102 may generate any type of metrology measurements of the sample 106. In one embodiment, the metrology tool 102 is an overlay metrology tool that provides overlay measurements, or measurements of overlay error associated with relative displacements of features patterned by multiple lithographic exposures on the same or different layers of the sample 106. In another embodiment, the metrology tool 102 provides measurements of one or more process parameters associated with one or more fabrication steps such as, but not limited to, intensity or dose of one or more lithographic steps. In another embodiment, the metrology tool 102 provides measurements of one or more patterned features on a sample 106 such as, but not limited to, critical dimension (CD) measurements or sidewall angle measurements.

The metrology tool 102 may generate metrology measurements using any optical characterization technique known in the art. For example, the metrology tool 102 may generate one or more images of the metrology system 100, where the metrology measurements are generated based on the images. Further, the images may include any combination of field-plane images of the sample 106 or pupil-plane images of an angular distribution of light from the sample 106 in response to incident illumination 108.

The metrology tool 102 may further be configurable according to a variety of recipes defining illumination and/or collection conditions. For example, a recipe may include, but is not limited to, a wavelength of illumination 108, a detected wavelength of light emanating from the sample 106, a spot size of illumination 108 on the sample 106, an angle of incident illumination 108, a polarization of incident illumination 108, a position of illumination 108 on the sample 106 (e.g., a position of an illumination spot), or the like.

As will be described in greater detail below, the pupil-plane scanner 104 may be located in a measurement path common to both an illumination pathway and a collection pathway and may include one or more deflectors located at one or more pupil planes. In this way, adjusting angles of the one or more deflectors may adjust a position of an illumination spot (or illumination distribution of one or more illumination spots) on the sample 106 without adjusting positions of illumination or collection pupil distributions. Further, it is to be understood that the pupil-plane scanner 104 may be operated in a scanning or static mode. For example, the pupil-plane scanner 104 may be used to provide a selected illumination distribution that is static during a measurement. By way of another example, the pupil-plane scanner 104 may be used to scan or otherwise modulate a position of one or more illumination spots during a measurement.

In another embodiment, the metrology system 100 includes a controller 110 communicatively coupled to the metrology tool 102 and/or any components therein.

In another embodiment, the controller 110 includes one or more processors 112. For example, the one or more processors 112 may be configured to execute a set of program instructions maintained in a memory device 114, or memory. The one or more processors 112 of a controller 110 may include any processing element known in the art. In this sense, the one or more processors 112 may include any microprocessor-type device configured to execute algorithms and/or instructions.

The one or more processors 112 of a controller 110 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 112 may include any device configured to execute algorithms and/or instructions (e.g., program instructions stored in memory). In one embodiment, the one or more processors 112 may be embodied as a desktop computer, mainframe computer system, workstation, image computer, parallel processor, networked computer, or any other computer system configured to execute a program configured to operate or operate in conjunction with the metrology system 100, as described throughout the present disclosure. Moreover, different subsystems of the metrology system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 110 may include one or more controllers housed in a common housing or within multiple housings. In this way, any controller or combination of controllers may be separately packaged as a module suitable for integration into metrology system 100.

The memory device 114 may include any storage medium known in the art suitable for storing program instructions executable by the associated one or more processors 112. For example, the memory device 114 may include a non-transitory memory medium. By way of another example, the memory device 114 may include, but is not limited to, a read-only memory (ROM), a random-access memory (RAM), a magnetic or optical memory device (e.g., disk), a magnetic tape, a solid-state drive and the like. It is further noted that the memory device 114 may be housed in a common controller housing with the one or more processors 112. In one embodiment, the memory device 114 may be located remotely with respect to the physical location of the one or more processors 112 and the controller 110. For instance, the one or more processors 112 of the controller 110 may access a remote memory (e.g., server), accessible through a network (e.g., internet, intranet and the like).

In this way, the controller 110 may direct (e.g., through control signals) or receive data from the metrology tool 102 or any components therein. The controller 110 may further be configured to perform any of the various process steps described throughout the present disclosure such as, but not limited to, directing the pupil-plane scanner 104 to position an illumination spot, directing the metrology tool 102 to generate one or more images based on one or more selected recipes, receiving images from the metrology tool 102, or generating metrology data based on the received images.

In one embodiment, the metrology system 100 includes a user interface 116 communicatively coupled to the controller 110. In one embodiment, the user interface 116 may include, but is not limited to, one or more desktops, laptops, tablets, and the like. In another embodiment, the user interface 116 includes a display used to display data of the metrology system 100 to a user. The display of the user interface 116 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 116 is suitable for implementation in the present disclosure. In another embodiment, a user may input selections and/or instructions responsive to data displayed to the user via a user input device of the user interface 116.

FIG. 1B is a conceptual view of the metrology tool 102, in accordance with one or more embodiments of the present disclosure. In one embodiment, the metrology tool 102 includes at least one illumination source 118 configured to generate illumination 108.

The illumination 108 from the illumination source 118 may include one or more selected wavelengths of light including, but not limited to, ultraviolet (UV) radiation, visible radiation, or infrared (IR) radiation. Further, the illumination 108 from the illumination source 118 may have any temporal profile including, but not limited to, a continuous-wave (CW) profile, a pulsed profile, or a modulated profile.

The illumination source 118 may generally include any type of illumination source suitable for providing at least one illumination beam. In one embodiment, the illumination source 118 is a laser source. For example, the illumination source 118 may include, but is not limited to, one or more narrowband laser sources, a broadband laser source, a supercontinuum laser source, a white light laser source, or the like. In this regard, the illumination source 118 may provide an illumination beam having high coherence (e.g., high spatial coherence and/or temporal coherence). In another embodiment, the illumination source 118 includes a laser-sustained plasma (LSP) source. For example, the illumination source 118 may include, but is not limited to, an LSP lamp, an LSP bulb, or an LSP chamber suitable for containing one or more elements that, when excited by a laser source into a plasma state, may emit broadband illumination. In another embodiment, the illumination source 118 includes a lamp source. For example, the illumination source 118 may include, but is not limited to, an arc lamp, a discharge lamp, an electrode-less lamp, or the like. In this regard, the illumination source 118 may provide an illumination beam having low coherence (e.g., low spatial coherence and/or temporal coherence).

In another embodiment, the metrology tool 102 directs the illumination beam to the sample 106 via an illumination pathway 120. For example, the metrology tool 102 may include an objective lens 122 to focus the illumination beam onto the sample 106. Further, the sample 106 may be disposed on a sample stage 124 suitable for securing the sample 106 and further configured to position the sample 106 (e.g., a metrology target on the sample 106) within a field of view of the objective lens 122.

The illumination pathway 120 may include one or more optical components suitable for modifying and/or conditioning the illumination beam as well as directing the illumination beam to the sample 106. In one embodiment, the illumination pathway 120 includes one or more illumination-pathway lenses 126 (e.g., to collimate the illumination beam, to relay pupil and/or field planes, or the like). In another embodiment, the illumination pathway 120 includes one or more illumination-pathway optics 128 to shape or otherwise control the illumination beam. For example, the illumination-pathway optics 128 may include, but are not limited to, one or more illumination field stops, one or more illumination pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like). Further, the illumination-pathway optics 128 may be located at any suitable location in the illumination pathway 120 such as, but not limited to, an illumination pupil plane 130 or an illumination field plane 132. For instance, the metrology tool 102 may include one or more relay optics (e.g., including one or more illumination-pathway lenses 126) for providing an illumination pupil plane 130 and/or an illumination field plane 132.

The metrology tool 102 may direct the illumination 108 to the sample 106 with any spatial and angular profile for a measurement. For example, the illumination 108 directed to the sample 106 may be shaped as at least one illumination beam (e.g., illumination lobe, or the like) having a limited angular profile. In this regard, the metrology tool 102 may provide dipole illumination, quadrature illumination, or the like. Additionally, periodic features on the sample 106 (e.g., features of a metrology target, device features, or the like) may diffract an illumination beam into discrete diffraction orders that may form the basis of a measurement.

The illumination 108 may be shaped into one or more illumination beams using a variety of techniques. In one embodiment, the metrology tool 102 includes a pupil mask in an illumination pupil plane 130 with one or more apertures to define the one or more illumination beams. In another embodiment, one or more illumination beams are directly generated by one or more illumination sources 118. For example, one or more illumination sources 118 may provide two or more illumination beams through two or more optical fibers, where light output from each optical fiber is an illumination lobe of the illumination beam. By way of another example, the illumination source 118 may generate two or more illumination beams by diffracting illumination 108 from an illumination source 118 into two or more diffraction orders, where the illumination beams are formed from at least some of the diffraction orders. Efficient generation of multiple illumination lobes through controlled diffraction is generally described in U.S. Patent Publication No. US2020/0124408 titled Efficient Illumination Shaping for Scatterometry Overlay and published on Apr. 23, 2020, which is incorporated herein by reference in its entirety.

Additionally, the illumination 108 may be shaped to illuminate a portion of the sample 106 smaller than a field of view of the objective lens 122. In this regard, the illumination 108 may be in the form of an illumination spot on the sample 106. For example, the metrology tool 102 may include a field stop located in an illumination field plane 132 to control a size and/or shape of the illumination spot. Further, the location of the illumination spot on the sample may be adjusted by the pupil-plane scanner 104.

In another embodiment, the metrology tool 102 includes one or more detectors 134 configured to capture light or other radiation emanating from the sample 106 (e.g., collected light 136) through a collection pathway 138. The collection pathway 138 may include one or more optical elements suitable for modifying and/or conditioning the collected light 136 from the sample 106. In one embodiment, the collection pathway 138 includes one or more collection-pathway lenses 140 (e.g., to collimate the illumination beam, to relay pupil and/or field planes, or the like), which may include, but is not required to include, the objective lens 122. In another embodiment, the collection pathway 138 includes one or more collection-pathway optics 142 to shape or otherwise control the collected light 136. For example, the collection-pathway optics 142 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like). Further, the collection-pathway optics 142 may be located at any suitable location in the collection pathway 138 such as, but not limited to, a collection pupil plane 144 or a collection field plane 146. For instance, the metrology tool 102 may include one or more relay optics (e.g., including one or more collection-pathway lenses 140) for providing a collection pupil plane 144 and/or a collection field plane 146.

A detector 134 may be located at any selected location within the collection pathway 138. In one embodiment, the metrology tool 102 includes a detector 134 at a collection field plane 146 or a conjugate thereof (e.g., as shown in FIG. 1B) to generate an image of the sample 106. In another embodiment, the metrology tool 102 includes a detector 134 at a collection pupil plane 144 (e.g., a diffraction plane) or a conjugate thereof to generate a pupil image. In this regard, the pupil image may correspond to an angular distribution of light from the sample 106 on the detector 134. For instance, diffraction orders associated with diffraction of illumination 108 by the sample 106 (e.g., an overlay target on the sample 106) may be imaged or otherwise observed in the collection pupil plane 144. In a general sense, a detector 134 may capture any combination of reflected (or transmitted), scattered, or diffracted light from the sample 106.

The metrology tool 102 may generally include any number or type of detectors 134 suitable for capturing light from the sample 106 indicative of overlay. In one embodiment, the detector 134 includes one or more detectors 134 suitable for characterizing a static sample. In this regard, the metrology tool 102 may operate in a static mode in which the sample 106 is static during a measurement. For example, a detector 134 may include a two-dimensional pixel array such as, but not limited to, a charge-coupled device (CCD) or a complementary metal-oxide semiconductor (CMOS) device. In this regard, the detector 134 may generate a two-dimensional image (e.g., a field-plane image or a pupil-plan image) in a single measurement.

In one embodiment, the detector 134 includes one or more detectors 134 suitable for characterizing a moving sample (e.g., a scanned sample). In this regard, the metrology tool 102 may operate in a scanning mode in which the sample 106 is scanned with respect to a measurement field during a measurement. Metrology on moving samples and associated metrology target layouts are described generally in U.S. patent application Ser. No. 16/586,504 filed on Sep. 27, 2019, U.S. patent application Ser. No. 16/598,146 filed on Oct. 10, 2019, and U.S. patent application Ser. No. 17/140,999 filed on Jan. 4, 2021, all of which are incorporated herein by reference in the entirety. For example, the detector 134 may include a 2D pixel array with a capture time and/or a refresh rate sufficient to capture one or more images during a scan within selected image tolerances (e.g., image blur, contrast, sharpness, or the like). By way of another example, the detector 134 may include a line-scan detector to continuously generate an image one line of pixels at a time. By way of another example, the detector 134 may include a time-delay integration (TDI) detector. A TDI detector may generate a continuous image of the sample 106 when the motion of the sample 106 is synchronized to charge-transfer clock signals in the TDI detector. In particular, a TDI detector acquires charge from light exposure on columns of pixels and includes clock pulses to transfer charge between adjacent columns of pixels along a scan direction. When the motion of the sample 106 along the scan direction is synchronized to the charge transfer in the TDI detector, charge continuously accumulates during the scan. This process continues until the charge reaches a final column of pixels and is subsequently read out of the detector. In this way, images of the object are accumulated over a longer time frame than would be possible with a simple line scan camera. This relatively longer acquisition time decreases the photon noise level in the image. Further, synchronous motion of the image and charge prevents blurring in the recorded image.

In another embodiment, as illustrated in FIG. 1B, the objective lens 122 may be common to both the illumination pathway 120 and the collection pathway 138. In this way, the objective lens 122 may simultaneously direct illumination 108 to the sample 106 and may capture the collected light 136 from the sample 106. Further, the metrology tool 102 may include a beamsplitter 148 to facilitate combined use of the objective lens 122 for illumination and collection of light.

Referring now to FIGS. 1C-1D, pupil-plane scanning is described in greater detail in accordance with one or more embodiments of the present disclosure.

In one embodiment, the metrology tool 102 includes a pupil-plane scanner 104 in a measurement path 150 common to both the illumination pathway 120 and the collection pathway 138. For example, in the non-limiting configurations of the metrology tool 102 illustrated in FIGS. 1B-1D, the measurement path 150 may lie between the beamsplitter 148 and the objective lens 122. However, it is to be understood that FIGS. 1C and 1D are provided solely for illustrative purposes and that the pupil-plane scanner 104 may be located in any measurement path common to both an illumination and collection pathway.

In one embodiment, the pupil-plane scanner 104 includes a pupil relay 152 formed from one or more optics arranged to generate one or more relayed pupil planes 154 located along the measurement path 150 and one or more deflectors 156 located in at least one of the relayed pupil planes 154. In this regard, the pupil-plane scanner 104 may adjust a position of the illumination 108 on the sample 106 (e.g., a position of an illumination spot on the sample 106) within a field of view of the objective lens 122 without translating the sample 106. For example, the pupil relay 152 may relay a pupil plane 158 from the objective lens 122 (e.g., a back focal plane associated with the objective lens 122) to the one or more relayed pupil planes 154.

It is contemplated herein that a deflector 156 may be, but is not required to be, located precisely on a relayed pupil plane 154. For example, as illustrated in FIG. 1C, the relayed pupil plane 154 and the deflector 156 are aligned to be co-planar. In one instance, the pupil relay 152 adjusts a tilt of the relayed pupil plane 154 to coincide with a deflector 156. In some embodiments, a deflector 156 may be located at a relayed pupil plane 154, but may be tilted with respect to the relayed pupil plane 154. However, it may be the case that misalignments of the deflector 156 and a relayed pupil plane 154 may introduce negligible measurement errors or errors within selected tolerances of a particular application.

A deflector 156 may include any type of optical deflector known in the art suitable for modifying an angle of light within the pupil relay 152. In one embodiment, a deflector 156 includes a rotatable or tiltable mirror (e.g., a mirror with adjustable tip and/or tilt). Further, the mirror may be actuated using any technique known in the art. For example, the deflector 156 may include, but is not limited to, a galvanometer, a piezo-electric mirror, or a micro-electro-mechanical system (MEMS) device. By way of another example, the deflector may include, but is not limited to, an acousto-optical deflector or an electro-optical deflector.

It is contemplated herein that adjusting an angle of a deflector 156 located at a relayed pupil plane 154 common to both the illumination pathway 120 and the collection pathway 138 may adjust a position of the illumination 108 on the sample 106 without impacting positions of the collected light 136 along optical paths unique to the collection pathway 138 (e.g., after the collected light 136 passes through the beamsplitter 148). In particular, the collected light 136 may be stationary at a collection pupil plane 144 and/or a collection field plane 146 while the deflector 156 is adjusted. In this regard, a metrology measurement based on the collected light 136 may not be impacted by adjustments of the deflector 156. For example, the distribution of light on a detector 134 at a collection pupil plane 144 may be stable while the deflector 156 is adjusted. It is contemplated herein that this may be particularly beneficial for diffraction-based or scatterometry-based metrology in which a metrology measurement is generated based on the distribution of light at a collection pupil plane 144 (e.g., a distribution of one or more diffraction orders in the collection pupil plane 144). By way of another example, the distribution of light on a collection field stop at a collection field plane 146 may be stable while the deflector 156 is adjusted.

Additionally, because the pupil-plane scanner 104 is located along the measurement path 150 that is common to both the illumination pathway 120 and the collection pathway 138, a distribution of the illumination 108 in an illumination pupil plane 130 and/or an illumination field plane 132 located only in the illumination pathway 120 (e.g., prior to the beamsplitter 148 in the configuration of FIGS. 1B-1D) may remain stable while the deflector 156 is adjusted. In this way, an angular distribution of the illumination 108 may be defined in an illumination pupil plane 130 common only to the illumination pathway 120 and will not be impacted by adjustments to the position of the illumination 108 on the sample 106.

It is further contemplated herein that the pupil-plane scanner 104 may include any number of deflectors 156 located in any number of relayed pupil planes 154. FIG. 1C is a schematic view of the pupil-plane scanner 104 with a single deflector 156 providing multi-axis (e.g., two-axis) angular deflection, in accordance with one or more embodiments of the present disclosure. In this regard, the single deflector 156 in FIG. 1C may be used to adjust the position of the illumination 108 on the sample 106 simultaneously along two directions. FIG. 1D is a schematic view of the pupil-plane scanner 104 with two deflectors 156, in accordance with one or more embodiments of the present disclosure. In this regard, each of the deflectors 156 in FIG. 1D may be used to adjust the position of the illumination 108 on the sample 106 along a single direction. Further, by orienting the two deflectors 156 to provide angular adjustments along different angular directions (e.g., orthogonal directions), the position of the illumination 108 on the sample 106 may be adjusted in two directions.

In another embodiment, the metrology tool 102 includes a feedback detector 160 for monitoring or otherwise observing the position of the illumination 108 on the sample 106. The feedback detector 160 may generally be located at any suitable field plane in the metrology tool 102. Further, the feedback detector 160 may include any type of detector known in the art including, but not limited to, a two-dimensional sensor for generating an image of the sample 106 in which the location of the illumination 108 on the sample 106 is visible.

In one embodiment, the metrology tool 102 includes a field relay 162 in the measurement path 150 to provide a relayed field plane 164, where the feedback detector 160 is located at the relayed field plane 164. For example, as illustrated in FIG. 1C, the field relay 162 may include a beamsplitter 166 in the measurement path 150 adjusted to direct a portion of the collected light 136 towards the feedback detector 160 for observation or monitoring. By way of another example, though not shown, the feedback detector 160 may be located at any suitable collection field plane 146 along the collection pathway 138.

In another embodiment, the feedback detector 160 is communicatively coupled to the controller 110. In this regard, the controller 110 may control or otherwise adjust the position of the illumination 108 on the sample 106 based on images of the sample 106 generated by the feedback detector 160. For example, the controller 110 may implement one or more image-processing steps to determine a position of the illumination 108 relative to any imaged features of the sample 106 such as, but not limited to, features of a metrology target or device features.

FIG. 2 is a flow diagram illustrating steps performed in a metrology method 200, in accordance with one or more embodiments of the present disclosure. Applicant notes that the embodiments and enabling technologies described previously herein in the context of the metrology system 100 should be interpreted to extend to the method 200. It is further noted, however, that the method 200 is not limited to the architecture of the metrology system 100.

In one embodiment, the method 200 includes a step 202 of illuminating a sample by directing illumination from an illumination source through a beamsplitter, along a measurement pathway, and through an objective lens.

In another embodiment, the method 200 includes a step 204 of collecting light from the sample with the objective lens and directing the collected light along the measurement pathway and through the beamsplitter to a detector located at a pupil plane.

In another embodiment, the method 200 includes a step 206 of adjusting a position of the illumination from the illumination source on the sample with one or more deflectors located at one or more relayed pupil planes between the objective lens and the beamsplitter. In this way, adjusting the one or more deflectors adjusts a position of illumination from the illumination source on the sample while maintaining a stable position of the collected light on the detector. For example, the step 206 of method 200 may be, but is not required to be, implemented using a pupil-plane scanner 104 located along a measurement path 150 common to an illumination pathway 120 and a collection pathway 138 as described with respect to the metrology system 100. In this way, the step 206 of method 200 may be implemented by one or more deflectors located at a relayed pupil plane common to the path of illumination directed to the sample and collected light received from the sample.

In another embodiment, the step 206 of method 200 may include capturing one or more field-plane images of the sample in which the position of illumination on the sample is visible and may further include controlling the position of the illumination on the sample based on the one or more field-plane images.

Referring now again generally to FIGS. 1A-2, it is contemplated herein that pupil-based scanning (e.g., using the pupil-plane scanner 104 as described herein) may facilitate accurate and efficient metrology measurements in numerous applications.

In one embodiment, the pupil-plane scanner 104 is configured to adjust the position of the illumination spot on the sample prior to a metrology measurement. For example, the pupil-plane scanner 104 may precisely adjust a position of the illumination 108 onto a metrology target, or a portion thereof (e.g., a cell of a metrology target) prior to a measurement. It is contemplated herein that the pupil-plane scanner 104 may provide faster and/or more accurate alignment of the illumination 108 on a sample 106 than the sample stage 124 alone. For instance, the sample stage 124 may generally require a period of time after movement for the stage to settle prior to a measurement. In accordance with embodiments of the present disclosure, the sample stage 124 may position a metrology target in a field of view of the objective lens 122 and the pupil-plane scanner 104 as a coarse alignment and the pupil-plane scanner 104 may provide fine alignment to a desired portion of the metrology target.

In another embodiment, the pupil-plane scanner 104 may facilitate rapid measurements of multiple locations within a field of view of the objective lens 122 (e.g., multiple cells of a metrology target). For example, it may be the case that a particular metrology measurement or set of metrology measurements may be based on metrology data from multiple cells of a metrology target. However, as described above, sequentially repositioning the illumination 108 on multiple cells of the metrology target may require stage settling times prior to each measurement. In accordance with embodiments of the present disclosure, once the metrology target is located within the field of view of the objective lens 122, the pupil-plane scanner 104 may rapidly position the illumination 108 on each desired cell to facilitate rapid measurements and high throughput.

In another embodiment, the pupil-plane scanner 104 may scan or otherwise modulate a position of the illumination 108 within a defined region during a measurement. For example, scanning or modulation of the position of the illumination 108 within a timeframe (e.g., an integration time of a detector 134, or the like) associated with a measurement may mitigate speckle caused by coherent illumination 108 and/or noise associated with roughness of features of a metrology target. Further, the pupil-plane scanner 104 may provide any selected pattern of the illumination 108 on the sample 106 including, but not limited to, a raster-scan pattern, a random pattern, or a pseudo-random pattern.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology measurement apparatus comprising:
one or more illumination sources;
a beamsplitter configured to receive illumination from the one or more illumination sources from an illumination pathway and direct the illumination along a measurement pathway;
an objective lens configured to direct the illumination from the measurement pathway to a sample, wherein the illumination is arranged to provide a selected illumination pupil distribution in a pupil plane of the objective lens defining incidence angles of the illumination on the sample, wherein the illumination is further arranged to provide an illumination spot on the sample having a smaller spot size than a field of view of the objective lens, wherein the objective lens is further configured to collect light from the sample and direct the collected light along the measurement pathway, wherein the beamsplitter is further configured to receive the collected light from the measurement pathway and direct the collected light along a collection pathway to one or more detectors; and
a pupil-plane scanner located between the objective lens and the beamsplitter along the measurement pathway, wherein the pupil-plane scanner comprises:
a pupil relay between the objective lens and the beamsplitter along the measurement pathway to relay a pupil plane from the objective lens to one or more relayed pupil planes located between the objective lens and the beamsplitter along the measurement pathway; and
one or more deflectors located in at least one of the one or more relayed pupil planes, wherein adjusting angular positions of the one or more deflectors adjusts a position of the illumination spot on the sample without modifying a position of the illumination pupil distribution or a position of a distribution of the collected light along the collection pathway.

2. The metrology measurement apparatus of claim 1, wherein the one or more deflectors are configured to adjust the position of the illumination spot on the sample prior to a measurement.

3. The metrology measurement apparatus of claim 1, wherein the one or more deflectors are configured to sequentially adjust the position of the illumination spot to two or more cells of a measurement target for sequential measurements of the two or more cells without translating the sample.

4. The metrology measurement apparatus of claim 1, wherein the one or more deflectors are configured to modulate the position of the illumination spot within a selected area of the sample during a measurement to mitigate at least one of speckle or roughness of features on a metrology target on the sample.

5. The metrology measurement apparatus of claim 4, wherein the selected area of the sample comprises:
    a cell of a metrology target.

6. The metrology measurement apparatus of claim 1, wherein at least one of the one or more detectors is located at a pupil plane along the collection pathway, wherein adjusting the one or more deflectors adjusts the position of the illumination spot on the sample while maintaining a stable distribution of light on the at least one of the one or more detectors.

7. The metrology measurement apparatus of claim 1, further comprising:
    a collection field stop located at a field plane along the collection pathway, wherein adjusting the one or more deflectors adjusts the position of the illumination spot on the sample while maintaining a stable distribution of light on the collection field stop.

8. The metrology measurement apparatus of claim 1, further comprising:
    an illumination field stop located at a field plane along the illumination pathway, wherein adjusting the one or more deflectors adjusts the position of the illumination spot on the sample while maintaining a stable distribution of light on the illumination field stop.

9. The metrology measurement apparatus of claim 1, further comprising:
    an additional beamsplitter in the measurement pathway;
    a field-plane relay to relay a field plane corresponding to the sample to a relayed field plane located outside the measurement pathway via the beamsplitter; and
    a feedback detector located at the relayed field plane, wherein the field detector images the illumination spot on the sample.

10. The metrology measurement apparatus of claim 9, further comprising:
    a controller communicatively coupled to the one or more deflectors and the feedback detector, wherein the controller includes one or more processors configured to execute program instructions causing the one or more processors to:
        receive one or more images from the feedback detector including the position of the illumination spot on the sample; and
        send control signals to the one or more deflectors to adjust the position of the illumination spot on the sample based on the one or more images.

11. The metrology measurement apparatus of claim 1, wherein at least one of the one or more deflectors comprises:
    a tiltable mirror.

12. The metrology measurement apparatus of claim 11, wherein the tiltable mirror comprises:
    at least one of a piezo-electric tiltable mirror or a galvanometer.

13. The metrology measurement apparatus of claim 1, wherein at least one of the one or more deflectors comprises:
    an acousto-optic deflector.

14. The metrology measurement apparatus of claim 1, wherein at least one of the one or more deflectors comprises:
    a micro-electro-mechanical system (MEMS).

15. The metrology measurement apparatus of claim 1, wherein the one or more deflectors comprise:
    a two-axis deflector configured to adjust the position of the illumination spot along two orthogonal directions on the sample.

16. The metrology measurement apparatus of claim 1, wherein the one or more deflectors comprise:
    a first one-axis deflector located at a first relayed pupil plane of the one or more relayed pupil planes configured to adjust the position of the illumination spot along a first direction on the sample; and
    a second one-axis deflector located at a second relayed pupil plane of the one or more relayed pupil planes configured to adjust the position of the illumination spot along a second direction on the sample orthogonal to the first direction.

17. A metrology system comprising:
    an illumination source;
    a pupil-plane detector;
    a translatable stage configured to position a sample;
    a beamsplitter, wherein the beamsplitter is configured to receive illumination from the illumination source and direct the illumination along a measurement pathway;
    an objective lens configured to direct the illumination from the measurement pathway to the sample, wherein the objective lens is further configured to collect light from the sample and direct the collected light along the measurement pathway, wherein the beamsplitter is configured to receive the collected light from the measurement pathway and direct the collected light along a collection pathway to the pupil-plane detector;
    an optical relay between the objective lens and the beamsplitter along the measurement pathway, wherein the optical relay provides one or more relayed pupil planes between the objective lens and the beamsplitter, wherein the optical relay further provides a relayed field plane between the objective lens and the beamsplitter;
    one or more deflectors located at the one or more relayed pupil planes, wherein adjusting the one or more deflectors adjusts a position of the illumination from the illumination source on the sample while maintaining a stable optical path of the collected light along the collection pathway;
    a feedback detector located at the relayed field plane to image the position of the illumination from the illumination source on the sample; and
    a controller communicatively coupled to the translatable stage and the feedback detector, wherein the controller includes one or more processors configured to execute program instructions to:
        receive one or more images from the feedback detector including the location of the illumination from the illumination source on the sample;
        send control signals to the one or more deflectors to position the illumination from the illumination source, based on the one or more images from the feedback detector, on a selected measurement spot for a measurement;

receive one or more measurement images from the pupil-plane detector; and generate one or more metrology measurements based on the one or more measurement images.

18. The metrology system of claim 17, wherein the one or more processors are further configured to execute program instructions causing the one or more processors to:

send control signals to the one or more deflectors to adjust the position of the illumination from the illumination source on the sample around a measurement spot during the measurement.

19. The metrology system of claim 17, wherein the one or more processors are configured to execute program instructions causing the one or more processors to send control signals to the one or more deflectors to maintain the position of the illumination from the illumination source, on the sample, on a measurement spot during the measurement while the sample is in motion.

20. The metrology system of claim 17, further comprising:

a field stop located at a field plane along the collection pathway, wherein adjusting the one or more deflectors adjusts the position of the illumination on the sample while maintaining a stable distribution of light on the field stop.

21. The metrology system of claim 17, wherein at least one of the one or more deflectors comprises:

a tiltable mirror.

22. The metrology system of claim 21, wherein the tiltable mirror comprises:

at least one of a piezo-electric tiltable mirror or a galvanometer.

23. The metrology system of claim 17, wherein at least one of the one or more deflectors comprises:

an acousto-optic deflector.

24. The metrology system of claim 17, wherein at least one of the one or more deflectors comprises:

a micro-electro-mechanical system (MEMS).

25. The metrology system of claim 17, wherein the one or more deflectors comprise:

a two-axis deflector configured to adjust the position of the illumination from the illumination source along two orthogonal directions on the sample.

26. The metrology system of claim 17, wherein the one or more deflectors comprise:

a first one-axis deflector located at a first relayed pupil plane of the one or more relayed pupil planes configured to adjust the position of the illumination from the illumination source along a first direction on the sample; and a second one-axis deflector located at a second relayed pupil plane of the one or more relayed pupil planes configured to adjust the position of the illumination from the illumination source along a second direction on the sample orthogonal to the first direction.

27. A metrology method comprising:

illuminating a sample by directing illumination from an illumination source through a beamsplitter, along a measurement pathway, and through an objective lens;

collecting light from the sample with the objective lens and directing the collected light along the measurement pathway and through the beamsplitter to a detector located at a pupil plane; and adjusting a position of the illumination from the illumination source on the sample with one or more deflectors located at one or more relayed pupil planes between the objective lens and the beamsplitter, wherein adjusting the one or more deflectors adjusts a position of illumination from the illumination source on the sample while maintaining a stable position of the collected light on the detector.

* * * * *